US009422637B2

(12) United States Patent
Hong et al.

(10) Patent No.: US 9,422,637 B2
(45) Date of Patent: Aug. 23, 2016

(54) SYSTEM OF CONTROLLING DIAMETER OF SINGLE CRYSTAL INGOT AND SINGLE CRYSTAL INGOT GROWING APPARATUS INCLUDING THE SAME

(75) Inventors: Young-Ho Hong, Gyeongbuk (KR); Se-Geun Ha, Gyeongbuk (KR); Yo-Han Jung, Gyeongbuk (KR)

(73) Assignee: LG Siltron Inc. (KR)

( * ) Notice: Subject to any disclaimer, the term of this patent is extended or adjusted under 35 U.S.C. 154(b) by 1105 days.

(21) Appl. No.: 13/306,973

(22) Filed: Nov. 29, 2011

(65) Prior Publication Data

US 2012/0145071 A1 Jun. 14, 2012

(30) Foreign Application Priority Data

Dec. 13, 2010 (KR) .................. 10-2010-0127061

(51) Int. Cl.
*C30B 15/26* (2006.01)
*C30B 15/20* (2006.01)
*C30B 15/22* (2006.01)

(52) U.S. Cl.
CPC .............. *C30B 15/26* (2013.01); *C30B 15/20* (2013.01); *C30B 15/22* (2013.01); *Y10T 117/10* (2015.01); *Y10T 117/1004* (2015.01); *Y10T 117/1008* (2015.01); *Y10T 117/1024* (2015.01)

(58) Field of Classification Search
CPC combination set(s) only.
See application file for complete search history.

(56) References Cited

U.S. PATENT DOCUMENTS

| | | | |
|---|---|---|---|
| 5,176,787 A * | 1/1993 | Kawashima et al. | ........... 117/14 |
| 5,183,528 A | 2/1993 | Baba et al. | |
| 6,325,851 B1 * | 12/2001 | Onoue | ............................ 117/14 |
| 6,447,601 B1 | 9/2002 | Phillips et al. | |
| 2001/0054376 A1 | 12/2001 | Miura et al. | |
| 2002/0043206 A1 | 4/2002 | Mutti et al. | |
| 2010/0024716 A1 | 2/2010 | Orschel et al. | |
| 2010/0206219 A1 | 8/2010 | Orschel et al. | |
| 2010/0263585 A1 | 10/2010 | Hamada | |

FOREIGN PATENT DOCUMENTS

| | | |
|---|---|---|
| CN | 1056165 | 11/1991 |
| CN | 1840746 | 10/2006 |
| EP | 0 444 628 | 9/1991 |
| JP | S 6469590 | 3/1989 |
| JP | 04-218705 | 8/1992 |

(Continued)

OTHER PUBLICATIONS

Japanese Application No. 2013-544374, Office Action dated Apr. 15, 2014 (Best available copy provided. English Translation not available.).

(Continued)

*Primary Examiner* — Duy Deo
*Assistant Examiner* — Erin Bergner
(74) *Attorney, Agent, or Firm* — Lewis Roca Rothgerber Christie LLP

(57) ABSTRACT

Provides are a system of controlling a diameter of a single crystal ingot and a single crystal ingot growing apparatus including the same. The system of controlling a diameter of a single crystal ingot includes: a diameter measuring sensor measuring a diameter of a single crystal ingot; a Low-Pass Filter (LPF) removing short period noise from measured data from the diameter measuring sensor; and an Automatic Diameter Control (ADC) sensor controlling the diameter of the single crystal ingot through controlling of a pull speed by using data having the noise removed as current data.

6 Claims, 6 Drawing Sheets

(56) References Cited

FOREIGN PATENT DOCUMENTS

| | | |
|---|---|---|
| JP | 2000-281481 | 10/2000 |
| JP | 2004-035352 | 2/2004 |
| JP | 2005-35823 | 2/2005 |
| JP | 2007-045687 | 2/2007 |
| JP | 2010-37190 | 2/2010 |
| TW | 2010-09133 | 3/2010 |

OTHER PUBLICATIONS

International Search Report for PCT/KR2011/005397 mailed Apr. 4, 2012, 6 pages.

Korean Application No. 2012-076788746, Notice of Allowance dated Dec. 18, 2012 (Best available copy provided. English Translation not available.).

Chinese Patent Application No. 201180059723.3 Office Action dated Feb. 13, 2015.

"Computer Test and Control", First Edition, Xingshan Li, p. 197-198, Press of Beijing University of Aeronautics and Astronautics, Jan. 31, 1990.

Chinese Patent Application No. 201180059723.3 Second Office Action dated Jul. 17, 2015.

\* cited by examiner

SYSTEM OF CONTROLLING DIAMETER OF SINGLE CRYSTAL INGOT AND SINGLE CRYSTAL INGOT GROWING APPARATUS INCLUDING THE SAME

CROSS-REFERENCE TO RELATED APPLICATIONS

This application claims the priority benefit of Korean patent application serial no. 10-2010-0127061, filed Dec. 13, 2010, the entirety of which is incorporated by reference herein.

BACKGROUND OF THE INVENTION

1. Field of the Invention

The present disclosure relates to a system of controlling a diameter of a single crystal ingot and a single crystal ingot growing apparatus including the same.

2. The Prior Art

In order to manufacture a semiconductor, a wafer needs to be prepared and in order to prepare the wafer, a single crystal needs to be grown in an ingot form. For this, a Czochralski method (hereinafter, a CZ method) may be applied.

Moreover, in order to achieve a high quality of a silicon single crystal ingot, a pull speed correction value is applied through various parameters. Also, various sensors installed at peripheral devices to control an ingot diameter that may affect its quality are configured to realize the uniform diameter. At this point, a Charge-Coupled Device (CCD) camera sensor and an Automatic Diameter Control (ADC) sensor, which are installed at the external of the device, are used for a pull speed and diameter control and a Proportional Integral Derivative controller (PID) controller is used to control information, diameters, and pull speeds, which are obtained from the sensors.

In relation to the CZ method, a single crystal ingot controlling system includes a motor driving unit for changing an actual pull speed to mutually meet a current change amount read from a diameter monitoring system and a target pull speed through operations of the PID controller.

According to a related art, after measuring a diameter of a single crystal using a CCD camera or an ADC sensor, if there is an error between a present value (PV) and a set value (SV), an output of a manipulated value (MV) that changes a pull speed is used in principle for allowing the diameter and the pull speed to reach a standard value. Accordingly, it may be expressed with pull speed control according to a diameter change.

P, I, and D values of the PID controller are components of proportion, integral, and differential and contribute to total output. An output intensity of each component is determined according to setting of the P, I, and D values.

Moreover, an important part of the PID controller is related to an actual value recognizing method. A sampling speed, a period, and a type of a value delivered by a sensor recognizing a diameter for controlling may greatly affect the PID control. Additionally, there are many variables about whether to process or average all raw data or about a period at which sampling is performed.

Additionally, reasonable pre-processing of information from a sensor before tuning of the P, I, and D constant values is required.

Furthermore, in order to obtain a high-quality silicon single crystal of zero-defects or very low defects through the silicon single crystal growing method, it is important to accurately control an actual pull speed with respect to a target pull speed set by V/G, i.e., a ratio of a pull speed V and a single crystal axial direction temperature gradient G.

If the actual pull speed is higher than the target pull speed, there is a vacancy defect such as Flow Pattern Defect (FPD) and on the contrary, if the actual pull speed is lower than the target pull speed, an Oxidation induced Stacking Fault (OISF) region occurs around the crystal and if growth is in progress at a slower speed, an interstitial defect such as Large Dislocation Pit (LDP) occurs. The defect such as OISF may cause fatal device fail during a process of a high-quality wafer such as a rapid thermal processing (RTP) wafer used for a dynamic random access memory (DRAM) or a flash memory according to a recently-reduced design rule. Therefore, in order to manufacture a high quality single crystal including only a remaining vacancy Pv region and a remaining interstitial Pi region, i.e., non-defective regions, accurately controlling of a pull speed is certainly required.

BRIEF DESCRIPTION OF THE INVENTION

Embodiments provide a system of controlling a diameter of a single crystal ingot and a single crystal ingot growing apparatus including the same.

In one embodiment, a system of controlling a diameter of a single crystal ingot includes: a diameter measuring sensor measuring a diameter of a single crystal ingot; a Low-Pass Filter (LPF) removing short period noise from measured data from the diameter measuring sensor; and an Automatic Diameter Control (ADC) sensor controlling the diameter of the single crystal ingot through controlling of a pull speed by using data having the noise removed as current data.

In another embodiment, a single crystal ingot growing apparatus may include the above system of controlling a diameter of a single crystal ingot.

According to a system of controlling a diameter of a single crystal ingot and a single crystal ingot growing apparatus including the same, the diameter of the single crystal ingot may be accurately controlled by precisely controlling a pull speed.

According to embodiments, short period noise may be removed through a pre-processing process by using a Low-Pass Filter (LPF) after sensing raw data about a diameter of a single crystal ingot. For example, according to embodiments, a measurement error signal (short period noise PN) of a short period, e.g., a 6 sec period, may be removed; spike type noise (SN) occurring at each 6 sec/4 by a node may be removed; and the remaining noise signal of about and less than 6 sec may be removed.

Additionally, according to embodiments, the diameter of a single crystal ingot may be accurately controlled by reducing the amplitude of a short period signal through an LPF. For example, a variation range of an actual pull speed may be reduced more by about 50% compared to existing one. Moreover, according to embodiments, a variation range of a diameter may be reduced more by about 30% compared to existing one. Furthermore, according to embodiments, a target diameter may be accurately controlled.

Additionally, according to embodiments, data average value number AVE may be controlled to reduce the amplitude. According to embodiments, after the data average value number AVE is applied, the amplitude is more reduced.

Moreover, according to embodiments, a range between a lower point and an upper point of an ADC digital filter is increased, thereby preventing information loss.

DETAILED DESCRIPTION

Figure 1:
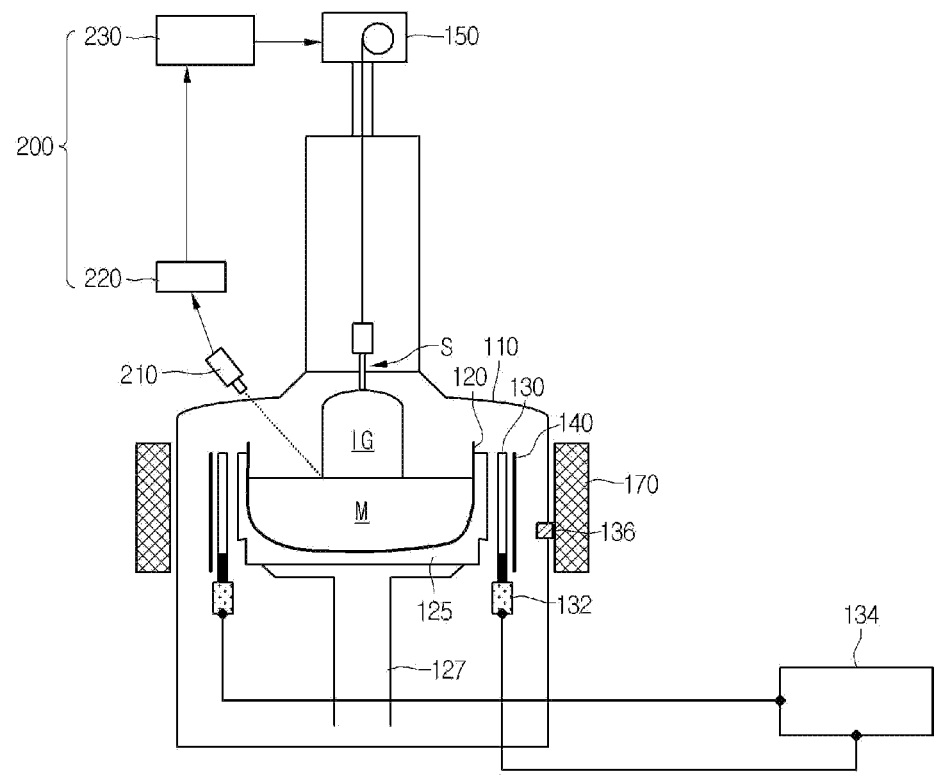
FIG. 1 is a view of a single crystal ingot growing apparatus including a system of controlling a diameter of a single crystal ingot according to an embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings. Also, the thickness of each layer in the drawings is an example, and is not limited thereto. It will be apparent to those skilled in the art that various modifications and variations can be made in the present invention without departing from the spirit or scope of the invention.

FIG. 1 is a view of a single crystal ingot growing apparatus including a system of controlling a diameter of a single crystal ingot according to an embodiment.

First, the single crystal growing apparatus to which a single crystal manufacturing method is applied will be described according to an embodiment.

The silicon single crystal growing apparatus may include a chamber 110, a crucible 120, a heater 130, and a pulling means 150.

For example, the silicon single crystal growing apparatus may include the chamber 110, the crucible 120 disposed in the chamber 110 and receiving silicon molten liquid, the heater 130 disposed in the chamber 110 and heating the crucible 120, and the pulling means 150 having a seed S combined to its one end.

The chamber 110 provides a space where predetermined processes for growing a single crystal ingot for a silicon wafer, which is used for electronic component material such as semiconductor, are performed.

A radiation insulator 140 for preventing a heat of the heater 130 from being released toward a sidewall of the chamber 110 may be installed at an inner wall of the chamber 110.

The crucible 120 is disposed inside the chamber 110 to contain silicon molten liquid and may be formed of quartz material. A crucible supporter 125 formed of graphite to support the crucible 120 may be disposed outside the crucible 120.

The crucible supporter 125 is fixed and installed on a rotation axis 127 and is rotated by the rotation axis 127 to maintain the same height of a solid-liquid interface as rotating and lifting the crucible 120.

The heater 130 may be disposed in the chamber 110 to heat the crucible 120. For example, the heater 130 may have a cylindrical shape surrounding the crucible supporter 125. The heater 130 melts a lump of high purity poly crystal silicon and, as result of this, provides silicon molten liquid.

A heater power supply 134 provides power to the heater 130 and an electrode 132 is interposed between the heater power supply 134 and the heater 130 to adjust the power. A temperature of the heater 130 may be measured by a heater temperature sensor 136.

According to an embodiment, a magnet 170 for improving turbulence control and ingot growing quality through adjustment of solution convection in the chamber 110 may be provided. For example, a horizontal super conducting magnet may be used for 300 mm ingot growth but is not limited thereto. The ingot means 150 may pull and rotate an ingot IG.

According to an embodiment, a Czochralski method (hereinafter, a CZ method), which grows crystal after dipping a single crystal seed S into silicon molten liquid and then while slowly pulling it up, may be adopted as a manufacturing method for growing a silicon single crystal ingot.

According to this method, a necking process is performed by dipping the seed S in poly crystal silicon molten liquid and growing it at a fast pull speed. Moreover, a soldering process is performed when single crystal is grown in a seed diameter direction and has a predetermined size of a diameter. After the soldering process, a body growing process is performed and after the body has a predetermined length, a tailing process for reducing the diameter of the body and separating it from the molten liquid is performed. As a result of that, a single crystal ingot growth is completed.

An embodiment provides a system of controlling a diameter of a single crystal ingot for accurately controlling a diameter and a pull speed of a single crystal ingot and a single crystal ingot growing apparatus including the same.

For this, the system 200 of controlling a diameter of a single crystal ingot may include a diameter measuring sensor 210 for measuring a diameter of a single crystal ingot IG; a Low-Pass Filter (LPF) 220 removing short period noise from the data measured by the diameter measuring sensor 210; and an Automatic Diameter Control (ADC) sensor 230 for controlling a diameter of a single crystal ingot through control of a pull speed by using the data with noise removed as current data.

The diameter measuring sensor 210 is disposed to sense raw data about a diameter of the single crystal ingot IG and may include at least one of an infrared (IR) sensor, a charged coupled device (CCD) camera, or pyrometer but is not limited thereto.

An analog current value of the diameter measuring sensor 210 is converted into a digital value through an A/D converter and after filtering data, the data are averaged at a predetermined period and this value may be used as a 'current value' in a Proportional Integral Derivative controller (PID) controller.

An embodiment may output a variation amount that automatically changes a single crystal pull speed because the PID controller calculates a deviation between a current value and a target value and a deviation change. A diameter of single crystal is changed according to a change of a pull speed therein and these operations are repeated to control a predetermined diameter.

Figure 2:
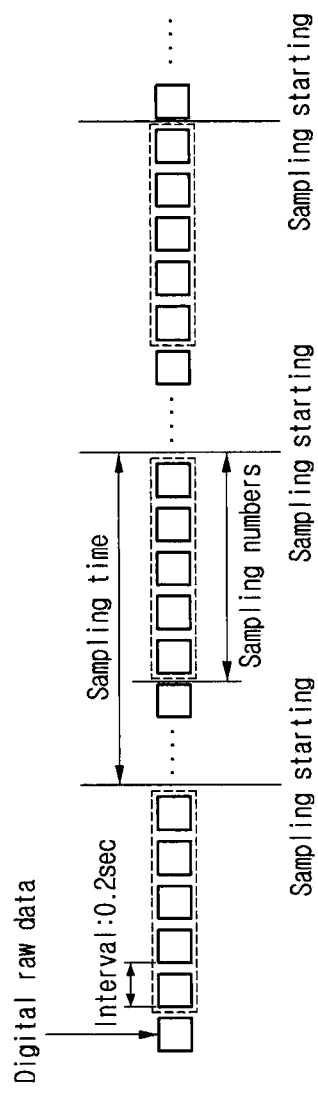
FIG. 2 is an exemplary view of data sampling in a system of controlling a diameter of a single crystal ingot according to an embodiment.

FIG. 2 is an exemplary view of data sampling in a system of controlling a diameter of a single crystal ingot according to an embodiment.

According to an embodiment, a PID controller performs a Proportional-Integral-Derivative (PID) logic operation on a single crystal pull speed by using the measured data of the ADC sensor 230.

At this point, as the PID controller performs an operation of reading the measured data related to a single crystal diameter, as shown in FIG. 2, a data pre-processing process for sampling digital raw data (a dotted box) according to a predetermined sampling time and sampling numbers may be performed.

In FIG. 2, a reading interval of the measured data is set as 0.2 sec; a sampling time is set as 1.4 sec; and sampling number is set as 5. However, an embodiment is not limited thereto.

The sampled data are used for a PID logic operation through an averaging process. During the HD operation, a deviation of a sampled measurement value and a target value and/or a deviation change are calculated to change a motor speed of a pulling means related to single crystal pulling, thereby controlling a pull speed of single crystal.

Figure 3:
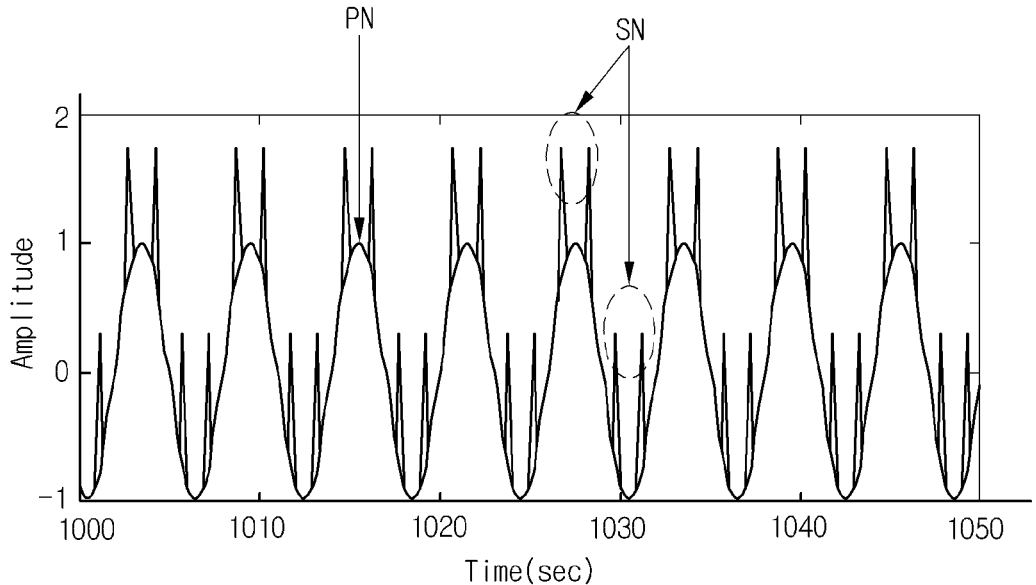
FIG. 3 is an exemplary view of raw data about a diameter in a system of controlling a diameter of a single crystal ingot according to an embodiment.

FIG. 3 is an exemplary view of raw data about a diameter in a system of controlling a diameter of a single crystal ingot according to an embodiment.

In more detail, FIG. 3 shows raw data about a diameter and is an exemplary view of raw data including a high frequency (short period) noise during single crystal ingot growth.

An embodiment removes a measurement error signal according to a rotational period of a seed. For example, when the seed rotates at 10 rpm, the rotation one period is 6 sec (60 sec/10) and a short period measurement error according to a rotation period is to be removed.

Additionally, according to an embodiment, when Si single crystal grows in the (100) direction, a node occurs in the (110) direction and a spike type signal is generated by occurrence of four nodes. For example, the four nodes occurring at the Si single crystal, which grow in the (100) direction, are generated once at 6/4 sec (period/4) as rotating at 10 rpm. Additionally, an embodiment removes a noise signal of a rotational period (about 6 sec) and less than that.

For example, FIG. 3 shows an example when diameter raw data are sampled at a reading interval of 0.2 sec and there is big shaking because periodic noise PN of 6 sec and spike type noise SN having a period of 6 sec/4 exceed a control allowable range, e.g., more than 100 pt with respect to 100 pt.

The spike type noise SN occurs when an ingot rotates by a node according to a crystallization direction of a single crystal ingot and for example, may occur at four times per one rotation (6 sec/4).

This high frequency (short period) noise gives an adverse effect on the ADC control. For example, since this short period noise has narrowness between a lower point and an upper point of the ADC digital filter, a large amount of normal information, for example, more than 50%, is cut off as a result of the narrowness. Accordingly, wrong information may be provided to the ADC controller and thus, this may cause malfunction of the ADC controller.

According to an embodiment, short period noise may be removed through a pre-processing process by using an LPF after sensing raw data about a diameter of a single crystal ingot.

Figure 4:
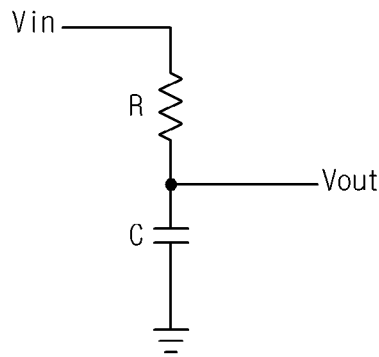
FIG. 4 is an exemplary view of an LPF circuit adopted in a system of controlling a diameter of a single crystal ingot according to an embodiment.
Figure 5:
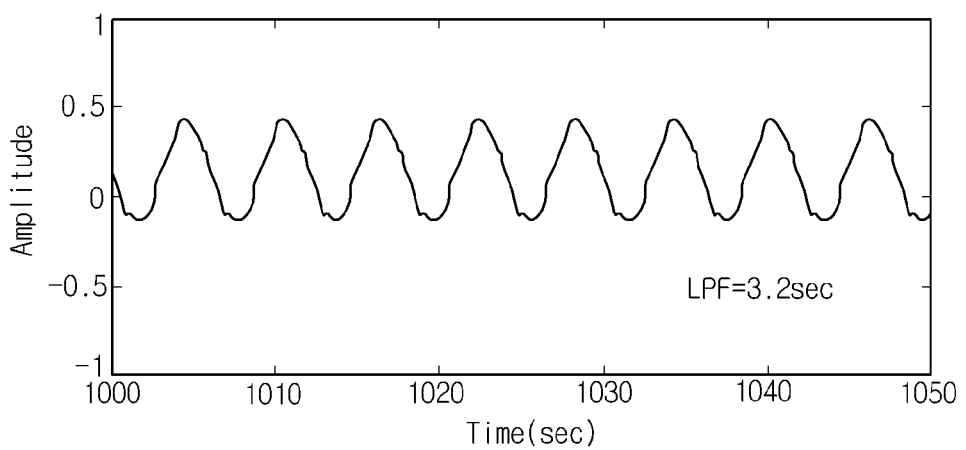
FIG. 5 is an exemplary view of a diameter controlled when a system of controlling a diameter of a single crystal ingot according to an embodiment is applied.

FIG. 4 is an exemplary view of an LPF circuit adopted in a system of controlling a diameter of a single crystal ingot according to an embodiment. FIG. 5 is an exemplary view of a diameter controlled when a system of controlling a diameter of a single crystal ingot according to an embodiment is applied.

For example, according to an embodiment, a measurement error signal (short period noise PN) of a short period, e.g., a 6 sec period, may be removed; a spike type noise SN occurring at each 6 sec/4 by a node may removed; and a noise signal about 6 sec and less than that may be removed.

For example, according to an embodiment, in order to remove the spike type noise of a node, a seed rotation is 10 rpm and if the number of nodes of an ingot is 4, 40 node periodicities are given for a 1 min (60 sec) and one period of a node is 60 sec/40(1.5 sec).

That is, according to a seed rotation (S/R) during run, a short period is determined and a range of a short period is about 3 sec to about 20 sec and a spike type signal period is about 0.75 sec to about 5 sec, but an embodiment is not limited thereto.

$$V_{out}(s) = \frac{1}{RCs + 1} V_{in}(s) \qquad \text{[Equation 1]}$$

Equation 1 is a transfer function for an LPF and a time constant ($\tau$f) of the LPF may be expressed with RC (R is a resistance value and C is a capacitance value).

According to an embodiment, if the time constant is greatly increased by an increase of the R value, drop phenomenon of an existing signal may occur. Accordingly, the R value may be controlled to be in a range of about 0.5% of a load resistance in an AD card but is not limited thereto. For example, if the load resistance is 1 □, R of the LPF may be less than 5 □.

Accordingly, a range of the time constant $\tau$f of an LPF may be between about 1 sec to about 15 sec. A value of the time constant $\tau$f of an LPF exemplarily is between about 1 sec to about 9.6 sec but is not limited thereto.

For example, if R1 is 1000Ω and C1 is 1000 μF, a time constant $\tau$f1 has a value of 1.0 sec. If R2 is 1000Ω and C1 is 3200 μF, a time constant $\tau$f2 has a value of 3.2 sec. If R3 is 3000Ω and C is 3200 μF, a time constant $\tau$f3 has a value of 9.6 sec.

$$V_{in}(t) = \sin(\omega t) \qquad \text{[Equation 2]}$$

$$V_{out}(t) = \frac{1}{\sqrt{(\tau_f \omega)^2 + 1}} \sin(\omega t + \phi) \qquad \text{[Equation 3]}$$

Equation 2 is about input amplitude and Equation 3 is about output amplitude. An amplitude of a short period signal is reduced according to an embodiment.

For example, referring to FIG. 5, when being applied to an LPF, if the time constant $\tau$f has a value of 3.2 sec, a measurement error signal (short period noise PN) of a short period, e.g., a 6 sec period, may be removed; spike type noise (SN) occurring at each 6 sec/4 by a node may be removed; and the remaining noise signal of about and less than 6 sec may be removed.

Additionally, according to an embodiment, a diameter of a single crystal ingot may be accurately controlled by reducing an amplitude of a short period signal through an LPF.

For example, a variation width of an actual pull speed may be reduced more than by about 50% compared to existing one.

Additionally, according to an embodiment, a variation width of a diameter may be reduced by about 30% compared to existing one.

Furthermore, according to an embodiment, a target diameter may be accurately controlled. For example, if a target diameter for an existing 300 mm ingot is set with about 308 mm, according to application of an embodiment, the target diameter is reduced to about 306 mm, so that it may be accurately controlled.

Moreover, according to a related art, scattering of raw data is reduced by a moving average filter but this has an effect on removing random noise but has no effect on removing periodic noise.

Thus, according to an embodiment, short period noise needs to be removed.

Figure 6:
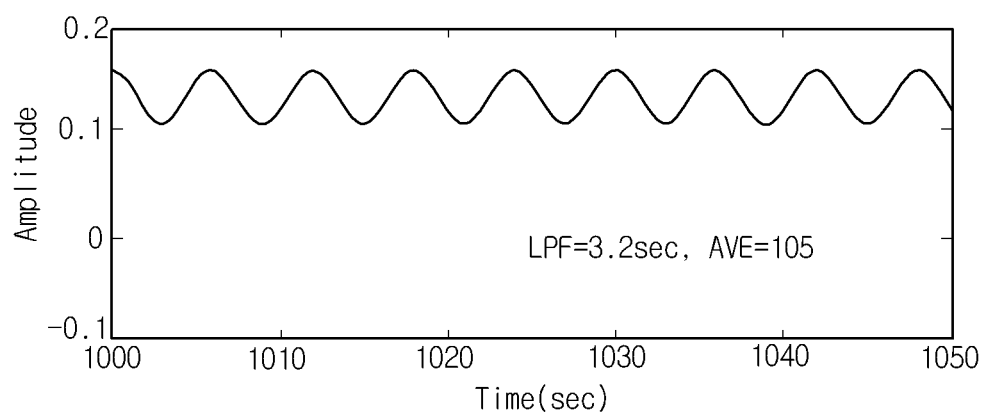
FIG. 6 is an exemplary view of a diameter controlled when a system of controlling a diameter of a single crystal ingot according to an embodiment is applied.

FIG. 6 is an exemplary view of a diameter controlled when a system of controlling a diameter of a single crystal ingot according to an embodiment is applied.

According to an embodiment, a data average value number AVE may be controlled to reduce amplitude.

For example, after short-period spike type noise of about 6 sec and less than that is removed through an LPF, during data processing, if a data average value number AVE and sampling time are considered, a diameter may be more accurately and effectively controlled.

The data average value number AVE may set a sampling data number by using an exact multiple of the sensed data but is not limited thereto.

For example, a relationship between a seed rotation period and a data average value number AVE may be an exact multiple or may be a half period (exact multiple+period/2).

For example, a data average value number AVE may be defined with ((a multiple of a period+period/2)/raw data measurement interval). The period may be 60 sec/seed target rpm.

For example, the data average value number AVE may be (a multiple of 6 sec+3 sec)/0.2 but is not limited thereto.

According to an embodiment, when the data average value data AVE is applied, the amplitude is reduced more. That is, according to an embodiment, when a sampling number is an exact multiple or half period relationship, a strong signal may be effectively removed periodically like a single crystal rotation.

According to an embodiment, a value of the data average value number AVE may have a range of 105 to 195 but is not limited thereto. Moreover, if the data average value number AVE is too large, a measurement error of a diameter is removed but a corresponding speed of an ADC controller becomes slower. If the data average value number AVE is too small, a corresponding speed of an ADC controller is fast but a measurement error of a diameter may not be removed.

According to an embodiment, the amplitude is reduced more by 30 times or 70 times through a control of the data average value number AVE. For example, with an LPF applied, when a time constant □f has a value of 3.2 sec and an AVE value is 105, the amplitude is reduced more by about 38 times. When a time constant □f has a value of 3.2 sec and an AVE value is 195, the amplitude is reduced more by about 71 times.

Moreover, according to an embodiment, a range of a lower point and an upper point of an ADC digital filter is increased to prevent information loss.

For example, since a range of a lower point and an upper point of an ADC digital filter is set with 5/5, it is too narrow. As a result of that, a large amount of normal information is cut off. According to an embodiment, a range of a lower point and an upper point of an ADC digital filter is set with 10/10 to prevent information loss and accordingly, a long period signal passes through as it is such that normal signals are transmitted.

According to an embodiment, a range of a lower point and an upper point of an ADC digital filter may vary according to a time constant to prevent information loss and may be set with about 6/6 to 80/80 but is not limited thereto.

Figure 7:
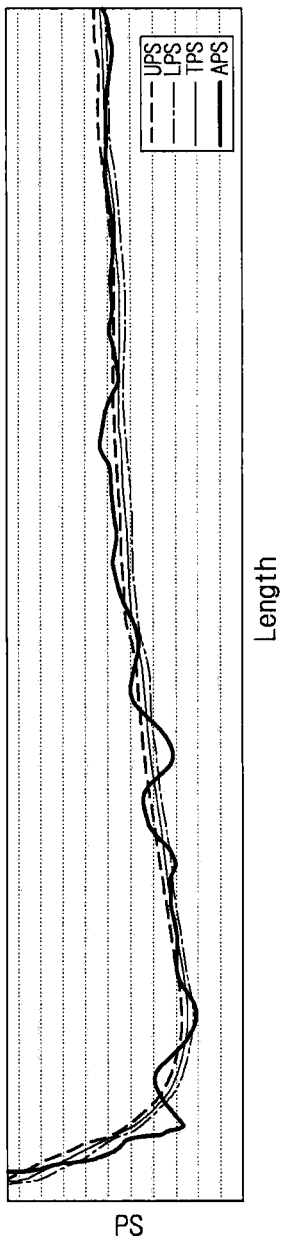
FIG. 7 is a view of a pull speed PS control for each ingot length according to a related art.
Figure 8:
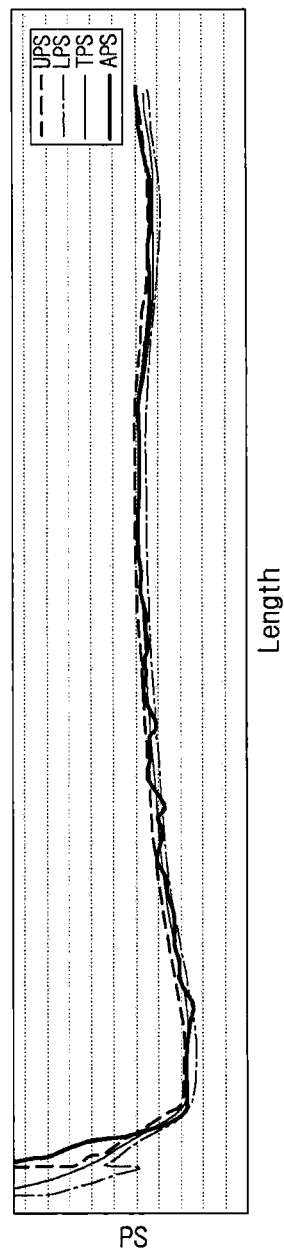
FIG. 8 is a view of a pull speed PS control for each ingot length according to an embodiment.

FIG. 7 is a view of a pull speed PS control for each ingot length according to a related art. FIG. 8 is a view of a pull speed PS control for each ingot length according to an embodiment.

Referring to FIGS. 7 and 8, values for pull speed raw data are not shown and only an upper pull speed UPS, lower pull speed LPS, target pull speed TPS, and average pull speed APS are shown. An x-axis represents an ingot length but is not limited thereto and thus may represent a frozen ratio and a y-axis represents a pull speed PS (rpm).

According to a related art, looking at a pull speed for each ingot length, the target pull speed TPS is set based on the upper pull speed UPS and the lower pull speed LPS. According to a related art, the average pull speed PS does not reach the target pull speed TPS so that there are many cases that deviate from ranges of the upper pull speed UPS and the lower pull speed LPS.

On the contrary, when the system of controlling a diameter of a single crystal ingot according to an embodiment is applied, it is shown in a profile that the average pull speed APS is substantially identical to the target pull speed TPS.

When the system of controlling a diameter of a single crystal ingot according to an embodiment is applied, it is confirmed that accurate control of a target pull speed with respect to an actual pull speed is effectively realized. According to this accurate control, a silicon single crystal ingot having a flawless region Pv/Pi over an entire body region without defects such as P-band, Flow Pattern Defect (FPD), and Large Dislocation Pit (LDP) may be manufactured.

According to a system of controlling a diameter of a single crystal ingot and a single crystal ingot growing apparatus including the same, a diameter of a single crystal ingot may be accurately controlled by accurately controlling a pull speed.

According to an embodiment, after sensing raw data about a diameter of a single crystal ingot, a pre-processing process is performed through an LPF so that short period noise may be removed. For example, according to an embodiment, a measurement error signal (short period noise PN) of a short period, e.g., a 6 sec period, may be removed, and spike type noise (SN) occurring at each 6 sec/4 by a node may be removed, and the remaining noise signal of about and less than 6 sec may be removed.

Additionally, according to embodiments, the diameter of a single crystal ingot may be accurately controlled by reducing the amplitude of a short period signal through an LPF. For example, a variation range of an actual pull speed may be reduced more by about 50% compared to existing one. Moreover, according to embodiments, a variation range of a diameter may be reduced more by about 30% compared to existing one. Furthermore, according to embodiments, a target diameter may be accurately controlled.

Additionally, according to embodiments, data average value number AVE may be controlled to reduce the amplitude. According to embodiments, after the average value of data AVE is applied, the amplitude is more reduced.

Moreover, according to embodiments, a range between a lower point and an upper point of an analog digital converter (ADC) digital filter is increased, thereby preventing information loss.

While the present invention has been particularly shown and described with reference to exemplary embodiments thereof, it will be understood by those of ordinary skill in the art that various changes in form and details may be made therein without departing from the spirit and scope of the present invention as defined by the following claims.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A system for controlling a diameter of a single crystal ingot, the system comprising:
    a diameter measuring sensor measuring a diameter of a single crystal ingot;
    a Low-Pass Filter (LPF) removing short period noise from measured data from the diameter measuring sensor, wherein the LPF is composed of a circuit including a resistor with a resistance value R and a capacitor with a capacitance value C, the LPF filtering an input voltage $V_{in}$ as a function of time (s) and outputting an output voltage $V_{out}$ according to the equation $V_{out}(s)=V_{in}(s)(1/RCs+1)$, the filter having a time constant (f) ranging from 1 to 15 seconds, the time constant f a function of the resistance value R and the capacitor value C; and
    an Automatic Diameter Control (ADC) sensor controlling the diameter of the single crystal ingot through controlling a pull speed by using data having the noise removed as current data, wherein the ADC sensor controls an average value AVE described by the formula AVE=((a multiple of an ingot rotation period+the rotation period/2)/a raw data measurement interval when controlling the pull speed).

2. The system according to claim 1, wherein the LPF removes short period noise or spike type noise from the measured data.

3. The system according to claim 2, wherein the range of the short period noise is between 3 sec and 20 sec, and a period of the spike type noise is between 0.75 sec and 5 sec.

4. A single crystal ingot growing apparatus including the system of controlling a diameter of a single crystal ingot according to claim 1.

5. A single crystal ingot growing apparatus including the system of controlling a diameter of a single crystal ingot according to claim 3.

6. A single crystal ingot growing apparatus, the apparatus comprising:
    a diameter measuring sensor measuring a diameter of a single crystal ingot;
    a Low-Pass Filter (LPF) removing short period noise from measured data from the diameter measuring sensor, wherein the LPF is composed of a circuit including a resistor with a resistance value R and a capacitor with a capacitance value C, the LPF filtering an input voltage $V_{in}$ as a function of time (s) and outputting an output voltage $V_{out}$ according to the equation $V_{out}(s)=V_{in}(s)(1/RCs+1)$, the filter having a time constant (f) ranging from 1 to 15 seconds, the time constant f a function of the resistance value R and the capacitor value C; and
    an Automatic Diameter Control (ADC) sensor controlling the diameter of the single crystal ingot through controlling a pull speed by using data having the noise removed as current data, wherein the ADC sensor controls an average value AVE described by the formula AVE=((a multiple of an ingot rotation period+the rotation period/2)/a raw data measurement interval when controlling the pull speed).

* * * * *